(12) United States Patent
Wang et al.

(10) Patent No.: US 8,123,985 B2
(45) Date of Patent: *Feb. 28, 2012

(54) ELECTROCONDUCTIVE THICK FILM COMPOSITION(S), ELECTRODE(S), AND SEMICONDUCTOR DEVICE(S) FORMED THEREFROM

(75) Inventors: Yueli Wang, Cary, NC (US); Kenneth Warren Hang, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/834,968

(22) Filed: Sep. 24, 2010

(65) Prior Publication Data
US 2011/0006268 A1     Jan. 13, 2011

Related U.S. Application Data

(62) Division of application No. 12/366,250, filed on Feb. 5, 2009, now abandoned, which is a division of application No. 11/106,262, filed on Apr. 15, 2005, now Pat. No. 7,494,607.

(51) Int. Cl.
*H01B 1/22* (2006.01)
(52) U.S. Cl. ........................................................ 252/514
(58) Field of Classification Search .......... 252/512–514; 257/768
See application file for complete search history.

(56) References Cited

U.S. PATENT DOCUMENTS

| | | | |
|---|---|---|---|
| 4,039,721 A * | 8/1977 | Weitze et al. ................. 428/426 |
| 4,256,513 A | 3/1981 | Yoshida et al. |
| 4,414,143 A | 11/1983 | Felton |
| 4,737,197 A | 4/1988 | Nagahara et al. |
| 5,302,557 A | 4/1994 | Carroll |
| 5,378,408 A | 1/1995 | Carroll et al. |
| 5,439,852 A * | 8/1995 | Hormadaly ..................... 501/26 |
| 5,645,765 A * | 7/1997 | Asada et al. ............. 252/519.51 |
| 5,795,501 A | 8/1998 | Kano |
| 6,132,937 A | 10/2000 | Suzuki |
| 6,406,646 B1 | 6/2002 | Lee et al. |
| 7,138,347 B2 | 11/2006 | Konno |
| 7,494,607 B2 * | 2/2009 | Wang et al. .................. 252/514 |
| 2002/0005507 A1 | 1/2002 | Matsumoto |
| 2002/0187317 A1 | 12/2002 | Tsuyuki et al. |
| 2004/0214016 A1 | 10/2004 | Adachi |
| 2004/0245508 A1 | 12/2004 | Wang et al. |

FOREIGN PATENT DOCUMENTS

| | | |
|---|---|---|
| EP | 1400987 | 3/2004 |
| JP | 11-330512 A | 11/1999 |
| JP | 2001-015782 A | 1/2001 |
| JP | 2001-127317 A | 5/2001 |
| JP | 2001-313400 A | 11/2001 |
| JP | 2003-223813 A | 8/2003 |
| JP | 2004-14146521 A | 5/2004 |
| WO | 02/082472 | 10/2002 |

* cited by examiner

*Primary Examiner* — Mark Kopec

(57) ABSTRACT

The present invention is directed to an electroconductive thick film composition comprising: (a) electroconductive metal particles selected from (1) Al, Cu, Au, Ag, Pd and Pt; (2) alloy of Al, Cu, Au, Ag, Pd and Pt; and (3) mixtures thereof; (3) glass frit wherein said glass frit is Pb-free; dispersed in (d) an organic medium, and wherein the average diameter of said electroconductive metal particles is in the range of 0.5-10.0 μm. The present invention is further directed to an electrode formed from the composition as detailed above and a semiconductor device(s) (for example, a solar cell) comprising said electrode.

9 Claims, 2 Drawing Sheets

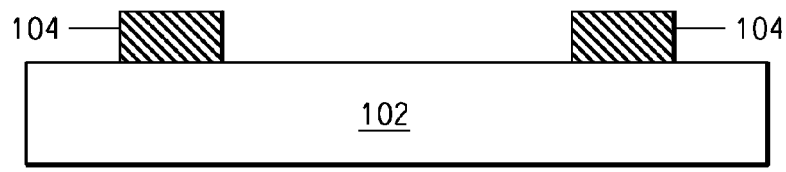
F I G. 2A
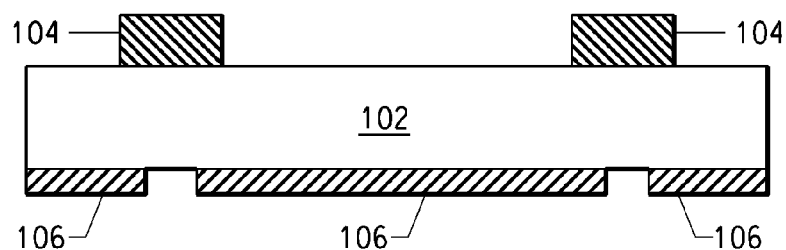
F I G. 2B
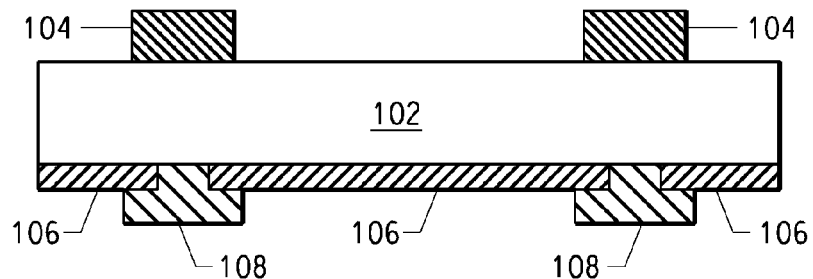
F I G. 2C
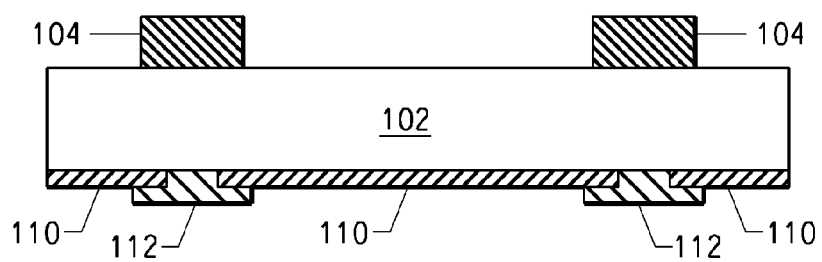
F I G. 2D

ELECTROCONDUCTIVE THICK FILM COMPOSITION(S), ELECTRODE(S), AND SEMICONDUCTOR DEVICE(S) FORMED THEREFROM

This application is a DIV of Ser. No. 12/366,250 (filed Feb. 5, 2009, now ABN), which application is a DIV of Ser. No. 11/106,262 (filed Apr. 14, 2005, now U.S. Pat. No. 7,494,607).

FIELD OF THE INVENTION

The present invention is directed primarily to thick film compositions, electrodes, and semiconductor devices. It is further directed to a silicon semiconductor device. In particular, it pertains to an electroconductive composition used in the formation of a thick film electrode of a solar cell. The present invention is further directed to a silver electroconductive thick film composition (paste) for a solar cell.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front-side or sun side of the cell and a positive electrode on the back side. It is well known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal contacts that are electrically conductive.

Most electric power-generating solar cells currently used on earth are silicon solar cells. Process flow in mass production is generally aimed at achieving maximum simplification and minimizing manufacturing costs. Electrodes in particular are made by using a method such as screen printing from a metal paste.

An example of this method of production is described below in conjunction with FIG. 1.

FIG. 1 shows a p-type silicon substrate, 10.

In FIG. 1(b), an n-type diffusion layer, 20, of the reverse conductivity type is formed by the thermal diffusion of phosphorus (P) or the like. Phosphorus oxychloride ($POCl_3$) is commonly used as the phosphorus diffusion source. In the absence of any particular modification, the diffusion layer, 20, is formed over the entire surface of the silicon substrate, 10. This diffusion layer has a sheet resistivity on the order of several tens of ohms per square ($\Omega/\square$), and a thickness of about 0.3 to 0.5 μm.

After protecting the front surface of this diffusion layer with a resist or the like, as shown in FIG. 1(c), the diffusion layer, 20, is removed from the rest of the surfaces by etching so that it remains only on the front surface. The resist is then removed using an organic solvent or the like.

Next, a silicon nitride film, 30, is formed as an anti-reflection coating on the n-type diffusion layer, 20, to a thickness of about 700 to 900 Å in the manner shown in FIG. 1(d) by a process, such as plasma chemical vapor deposition (CVD).

As shown in FIG. 1(e), a silver paste, 500, for the front electrode is screen printed then dried over the silicon nitride film, 30. In addition, a back side silver or silver/aluminum paste, 70, and an aluminum paste, 60, are then screen printed and successively dried on the back side of the substrate. Firing is then typically carried out in an infrared furnace at a temperature range of approximately 700 to 950° C. for a period of from several minutes to several tens of minutes.

Consequently, as shown in FIG. 1(f), aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The back side silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver or silver/aluminum back electrode is formed over portions of the back side (often as 5-6 mm wide busbars) as an electrode for interconnecting solar cells by means of copper ribbon or the like. In addition, the front electrode-forming silver paste, 500, sinters and penetrates through the silicon nitride film, 30, during firing, and is thereby able to electrically contact the n-type layer, 20. This type of process is generally called "firing through." This fired through state is apparent in layer 501 of FIG. 1(f).

As noted above, the back surface electrode that is used to interconnect the solar cells through soldering may comprise Ag or Ag/Al compositions. When prior art Ag compositions are used, they can provide good solderability and adhesion. However, since the Ag compositions cannot produce a back surface field, conversion efficiency of the solar cell suffers. On the other hand, when Ag/Al compositions are used, adhesion strength is generally lowered and gives rise to concerns regarding long term reliability. This is due to the fact that the addition of Al will generally hurt solderability and thus, adhesion performance.

Furthermore, there is an on-going effort to provide compositions which are Pb-free while at the same time maintaining electrical performance and other relevant properties of the device. The present inventors provide novel Ag/Al comprising composition(s) and semiconductor devices which simultaneously provide such a Pb-free system while still maintaining electrical performance, and improving adhesion. The current invention provides such compositions and devices. Furthermore, the composition(s) of the present invention lead to reduced bowing in some embodiments of the invention.

SUMMARY OF THE INVENTION

The present invention is directed to an electroconductive thick film composition comprising:
(a) electroconductive metal particles selected from (1) Al, Cu, Au, Ag, Pd and Pt; (2) alloy of Al, Cu, Au, Ag, Pd and Pt; and (3) mixtures thereof;
(b) glass frit wherein said glass frit is Pb-free; dispersed in
(c) an organic medium, and wherein the average diameter of said electroconductive metal particles is in the range of 0.5-10.0 µm. The present invention is further directed to an electrode formed from the composition, as detailed above, and a semiconductor device comprising said electrode.

BRIEF DESCRIPTION OF THE FIGURES

FIGS. 2(a)-(d) explain the manufacturing processes for manufacturing a solar cell using the electroconductive paste of the present invention. Reference numerals shown in FIG. 2 are explained below.
- 102 Silicon substrate
- 104 Light-receiving surface side electrode
- 106 Paste composition for a first electrode
- 108 Electroconductive paste for a second electrode
- 110 First electrode
- 112 Second electrode

DETAILED DESCRIPTION OF THE INVENTION

Figure 1A:
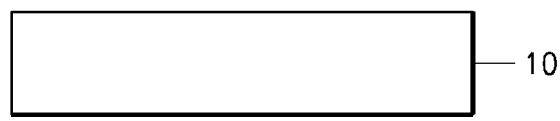
FIG. 1 is a process flow diagram illustrating the fabrication of a semiconductor device. Reference numerals shown in FIG. 1 are explained below.
- 10: p-type silicon substrate
- 20: n-type diffusion layer
- 30: silicon nitride film, titanium oxide film, or silicon oxide film
- 40: p+ layer (back surface field, BSF)
- 60: aluminum paste formed on back side
- 61: aluminum back electrode (obtained by firing back side aluminum paste)
- 70: silver/aluminum paste formed on back side
- 71: silver/aluminum back electrode (obtained by firing back side silver/aluminum paste)
- 500: silver paste formed on front side
- 501: silver front electrode (formed by firing front side silver paste)
Figure 1B:
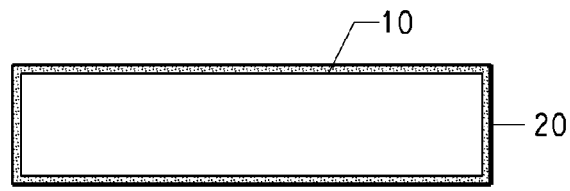
Figure 1C:
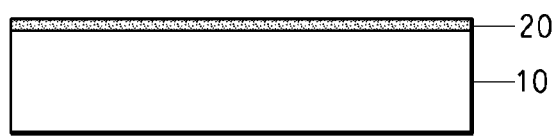
Figure 1D:
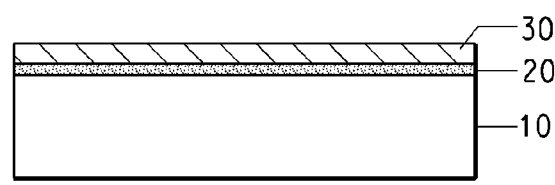
Figure 1E:
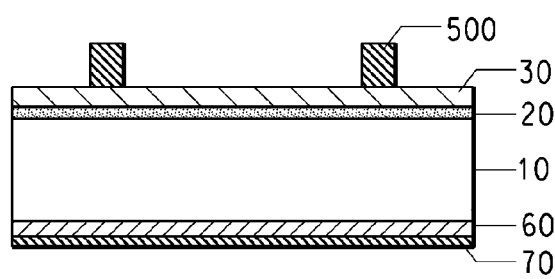
Figure 1F:
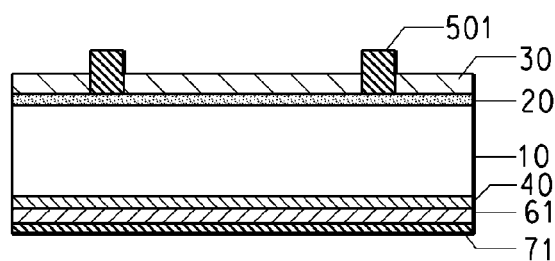

The conductive thick film composition (paste) of the present invention provides the ability to form an electrode from said paste wherein the electrode has high adhesion on the Si substrate, high back surface field, and low bowing.

In order to achieve the above-mentioned objective, the present invention is a conductive thick film composition, in particular a silver/aluminum electroconductive paste, which comprises silver and aluminum particles, glass particles, optional inorganic additives, and an organic vehicle, and is used in an electrode for connecting a back face terminal on the silicon substrate of a solar cell. It is characterized by the fact that the average particle diameter of said silver/aluminum particles is 0.5-10.0 µm. In the present invention, preferably, the silver particles are included at 40-93 wt % based on the total weight of the paste, aluminum is in the 1-5 wt % based on the total weight of the paste, the glass particles are included at 2-0 wt % based on the total weight of the paste, the inorganic additive is in the 0-2 wt % based on the total weight of the paste, and the organic vehicle is included at 5-50 wt % based on the total weight of the paste. Furthermore, it is preferable for the glass powder included in the silver electroconductive paste to have a softening point of 300-550° C.

The electroconductive paste of the present invention is used either in direct contact with the Si substrate or printed on top of the Al film.

Each component of the electroconductive thick film paste of the present invention is explained in detail below.

1. Electroconductive Metal

In the present invention, the conductive phase is most preferably the silver(Ag)/aluminum(Al); however, an electroconductive metal(s) other than silver/aluminum, for example, Cu, Au, Ag, Pd, Pt, Al, Ag—Pd, Pt—Au, etc., can also be used. In fact, the electroconductive metal particles may be selected from (1) Al, Cu, Au, Ag, Pd and Pt; (2) alloy of Al, Cu, Au, Ag, Pd and Pt; and (3) mixtures thereof.

Typically, as the electroconductive metal usable in the electroconductive paste of the present invention, silver (Ag) and aluminum (Al) will be the conductive phase in the present composition. The silver and aluminum particles are preferably in the flake or spherical (sometimes referred to as powder) form. Silver is used to benefit its high conductivity and solderability; aluminum is used to benefit its capability of inducing back surface field and thus conversion efficiencies.

It is preferable for the silver and aluminum to have a high purity (99+%); however, a substance with a low purity can also be used in response to the electrical demand of the electrode pattern.

2. Inorganic Binder

It is preferable for the electroconductive paste of the present invention to include an inorganic binder. The inorganic binder usable in the present invention is a glass frit with a preferred softening point of in the range of 300-550° C., so that the electroconductive paste can be fired at 700-950° C., appropriately sintered and wetted, and appropriately adhered to a silicon substrate. If the softening point is lower than 300° C., the glass may melt early and get to the surface of the electrode and interfere with soldering. On the other hand, if the softening point is higher than 550° C., the glass will not have enough time to soften and wet the conductive phases, and a sufficient adhesive strength is not exerted, and the liquid-phase sintering of the silver sometimes cannot be promoted. It is understood that if the firing temperature range used in the process is changed, the softening point temperature range of the optimal glass frit will also change.

Here, the "softening point" is that obtained by the fiber elongation method of ASTM C338-57.

The glass chemistry plays a role in the current invention, not only on the adhesion strength, but also on the bowing and electricals. Furthermore, the invention is limited to Pb-free glass. Useful glasses in the present invention include bismuth-based glasses. Some typical glass compositions comprise the following (in weight percent total glass composition): SiO2: 0.5-35%; Al2O3: 0-5%; B2O3: 1-15%; ZnO: 0-15%: Bi2O3: 55-90%. Selected glass compositions are listed in Table 1.

The content of the glass frit as the inorganic binder is not particularly limited as long as it is an amount that can achieve the objective of the present invention; however, the content is typically 1-10 weight percent, preferably 2-6 weight percent, based on the total weight of the electroconductive paste.

If the amount of the inorganic binder is smaller than 1 weight percent, the adhesive strength is sometimes insufficient and electrical performance may also be affected, and if the amount of the inorganic binder is more than 10 weight percent, soldering may become very difficult. In addition, bowing could be affected adversely as the percentage of glass content increases.

3. Optional Inorganic Additives

The glass frit (inorganic binders) used in the compositions of the present invention provide adhesion, however the total amount of inorganic glass binder that may be added to the total electroconductive composition is limited by bowing and solderability requirements. Therefore additional inorganic additives may, optionally be added to increase adhesion characteristics. These additional optional additives may be selected from (1) TiB2, Cu, Ti, Al, Sn, Sb, Cr, Fe, Mn, Co, Ni, Ru, B and Bi; (2) compounds that can generate elemental metals selected from Cu, Ti, Al, Sn, Sb, Cr, Fe, Mn, Co, Ni, Ru, B and Bi; (3) oxides of Cu, Ti, Al, Sn, Sb, Cr, Fe, Mn, Co, Ni, Ru, B and Bi; and (4) mixtures thereof.

The present inventors have found that small amounts of optional additives, such as Cu powder or metal oxides, $Bi_2O_3$, $TiO_2$, $TiB_2$, $Al_2O_3$, $B_2O_3$, $SnO_2$, $Sb_2O_5$, $Cr_2O_3$, $Fe_2O_3$, $CuO$, $Cu_2O$, $MnO_2$, $Co_2O_3$, $NiO$, $RuO_2$, etc. can help increase adhesion characteristics, without affecting electrical performance and bowing.

The average diameter of the optional inorganic additives is in the range of 0.5-10.0 μm, or dispersed to the molecular level when the additives are in the form of organo-metallic compounds.

4. Organic Medium

The inorganic components are typically mixed with an organic medium by mechanical mixing to form viscous compositions called "pastes", having suitable consistency and rheology for printing. A wide variety of inert viscous materials can be used as organic medium. The organic medium must be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties. The organic vehicle used in the thick film composition of the present invention is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 8 weight percent to 11 weight percent of the total composition. The thick film composition of the present invention may be adjusted to a predetermined, screen-printable viscosity with the organic medium.

The ratio of organic medium in the thick film composition to the inorganic components in the dispersion is dependent on the method of applying the paste and the kind of organic medium used, and it can vary. Usually, the dispersion will contain 70-95 wt % of inorganic components and 5-30 wt % of organic medium (vehicle) in order to obtain good wetting.

The electroconductive paste of the present invention is typically conveniently manufactured by power mixing, a dispersion technique that is equivalent to the traditional roll milling. The electroconductive paste of the present invention is preferably spread on the desired part of the back face of a solar cell by screen printing; in spreading by such a method, it is preferable to have a viscosity in a prescribed range. The viscosity of the electroconductive paste of the present invention is preferably 80-200 PaS when it is measured at 10 rpm and 25° C. by a utility cup using a Brookfield HBT viscometer and #14 spindle.

The electroconductive paste of the present invention can be used either in direct contact with Si wafers or printed on top of the dried Al film. The Ag/Al film can be cofired with Al at the same time in a process called cofiring. Next, an example in which a solar cell is prepared using the electroconductive paste (silver/aluminum electroconductive paste) of the present invention is explained, referring to the figure (FIG. 2).

First, a Si substrate 102 is prepared. On the light-receiving side face (surface) of the Si substrate, electrodes (for example, electrodes mainly composed of Ag) 104 are installed (FIG. 2(a)). On the back face of the substrate, aluminum pastes used as a back face electrode for a solar cell (although it is not particularly limited as long as it is used for a solar cell, for example, PV333, PV322 (commercially available from E. I. du Pont de Nemours and Company)) 106 are spread by screen printing, etc., then dried (FIG. 2(b)). The electroconductive paste of the present invention is then spread in a partially overlapped state with the aluminum paste which was printed and dried in advance, and dried (FIG. 2(c)). The drying temperature of each paste is preferably 150° C. or lower. Also, the aluminum paste preferably has a dried film thickness of 40-60 μm, and the thickness of the silver/aluminum electroconductive paste of the present invention is preferably 15-25 μm. Also, the overlapped part of the aluminum paste and the silver/aluminum electroconductive paste is preferably about 0.5-2.5 mm.

Next, the substrate obtained is fired at a temperature of 700-950° C. for about 1-15 min, for instance, so that the desired solar cell is obtained (FIG. 2(d)). An electrode is formed from the composition(s) of the present invention wherein said composition has been fired to remove the organic medium and sinter the glass frit.

The solar cell obtained using the electroconductive paste of the present invention, as shown in FIG. 2(d), has electrodes 104 on the light-receiving face (surface) of the substrate (for example, Si substrate) 102, Al electrodes 110 mainly composed of Al and silver/aluminum electrodes 112 mainly composed of Ag and Al, on the back face.

EXAMPLES

Next, the present invention is explained in further detail by an application example. In the following application example, a manufacturing example of the silver/aluminum electroconductive paste of the present invention and an example in which the silver/aluminum electroconductive paste is used as an electrode material for the back face of a Si substrate in manufacturing a solar cell are explained.

Application Example 1

Application Example 1 is detailed below.

The appropriate amount of organic medium, glass frit, inorganic additives, and Ag/Al are mixed in a vacuum mixer for 15-30 min. The mixture was then sent through a power mixer or roll mill to disperse the ingredients thoroughly. The degree of dispersion is measured by Fineness of Grind (FOG). When dispersion was sufficient, the paste was formulated to the required solids and viscosity level.

Manufacture of Solar Cell

The present invention can be applied to a broad range of semiconductor devices, although it is especially effective in light-receiving elements such as photodiodes and solar cells.

The discussion below describes how a solar cell was formed utilizing the composition(s) of present invention.

Using the silver/aluminum electroconductive paste obtained, a solar cell was formed in the following sequence.

(1) On the back face of a Si substrate having a silver electrode on the front surface, the newly invented Ag/Al paste is printed and dried. Typical dried thickness is in the range of 15 to 25 microns. Then an aluminum paste for the back face electrode of a solar cell (for example, PV333, commercially available from E. I. du Pont de Nemours and Company) was screen-printed at a dried film thickness of 40-60 μm. The Ag/Al was printed as 5-6 mm wide bus bars, and the aluminum film overlaps with the Ag/Al busbar for 1 mm at both edges to ensure electrical continuity. In some applications, the entire backside may be covered with grid lines of Ag/Al, and in such situations, no Al paste will need to be printed.

(2) The printed wafers were then fired in a furnace with peak temperature settings of 700 to 950 C for 1 to 10 minutes, depending on the furnace dimensions and temperature settings. A solar cell was formed after firing.

Test Procedure—Efficiency

The solar cells built according to the method described above were placed in a commercial IV tester for measuring efficiencies. The light bulb in the IV tester simulated the sunlight with a known intensity and radiated the front surface of the cell, the bus bars printed in the front of the cell were connected to the multiple probes of the IV tester and the electrical signals were transmitted through the probes to the computer for calculating efficiencies.

Test Procedure—Adhesion

After firing, a solder ribbon (copper coated with 62Sn/36Pb/2Ag) was soldered to the bus bars printed on the backside of the cell. Solder condition was typically at 345° C. for 5 seconds. Flux used was MF200. The soldered area was approximately 2 mm×2 mm. The adhesion strength was obtained by pulling the ribbon at an angle of 90° to the surface of the cell. An assessment of the adhesion strength was assigned as low, adequate, or good, based on the assumption that an adhesion strength less than 200 g is considered low; values in the range of 200 g to 300 g is adequate, values in the range of 300 to 400 or above is good.

Since the current invention comprises only Pb-free glass as the frit, we tested adhesion using both Pb-free solder and Pb-containing solder. The Pb-free solder used was 96.5Sn/3.5Ag. Solder temperature for the Pb-free solder was in the range of 345-375° C., solder time was 5-7 s. Flux used was MF200.

Criterion on bowing is as follows: >1 mm was considered high, 0.6-1 mm was medium and <0.6 mm was considered low.

Example compositions are listed in Table 2. Glass Compositions referenced in Table 2 are detailed in Table 1. The performance characteristics of the examples are listed in Table 3.

What is claimed is:

1. A thick film conductive composition comprising:
   (a) electroconductive metal particles consisting essentially of Ag particles,
   (b) glass frit wherein said glass frit is Pb-free, and wherein said glass frit comprises, in weight percent total glass frit composition: $SiO_2$ 0.5-35, $Al_2O_3$ 0-5, $B_2O_3$ 1-15, ZnO 0-15, and $Bi_2O_3$ 55-90;
   (c) one or more inorganic Cu additives, wherein said inorganic Cu additives are selected from the group consisting of (1) Cu; (2) compounds that can generate elemental Cu; (3) oxides of Cu; and (4) mixtures thereof; and
   (d) one or more inorganic Bi additives, wherein said inorganic Bi additives are selected from the group consisting of (1) Bi; (2) compounds that can generate elemental Bi; (3) oxides of Bi; and (4) mixtures thereof; and
   (e) an organic medium.

2. An electrode formed from the composition of claim 1 wherein said composition has been fired to remove the organic medium and sinter said glass frit.

3. A semiconductor device comprising the electrode of claim 2.

4. The composition of claim 1, wherein the glass frit is 2-6 wt % of the total composition.

5. The composition of claim 1, wherein the average diameter of said electro conductive metal particles is in the range of 0.5-10.0 μm.

6. The composition of claim 1 further comprising one or more inorganic additives that are selected from the group consisting of (1) $TiB2$, Ti, Al, Sn, Sb, Cr, Fe, Mn, Co, Ni, Ru, and B; (2) compounds that can generate elemental metals selected from, Ti, Al, Sn, Sb, Cr, Fe, Mn, Co, Ni, Ru, B and; (3) oxides of, Ti, Al, Sn, Sb, Cr, Fe, Mn, Co, Ni, Ru, and B; and (4) mixtures thereof.

7. The composition of claim 1 comprising, based on weight percent total composition: 40-93 weight percent Ag particles, 2-10 weight percent of said glass frit, and 5-50 weight percent organic medium.

8. The thick film composition of claim 1 wherein said electroconductive metal particles are in the form selected from (1) flakes, (2) spherical and (3) mixtures thereof.

9. A thick film conductive composition comprising:
   (a) electroconductive metal particles selected from the group consisting of Ag particles and Al particles and mixtures thereof,
   (b) glass frit wherein said glass frit is Pb-free, and wherein said glass frit comprises, in weight percent total glass frit composition: $SiO_2$ 0.5-35, $Al_2O_3$ 0-5, $B_2O_3$ 1-15, ZnO 0-15, and $Bi_2O_3$ 55-90;
   (c) one or more inorganic Cu additives, wherein said inorganic Cu additives are selected from the group consisting of (1) Cu; (2) compounds that can generate elemental Cu; (3) oxides of Cu; and (4) mixtures thereof; and
   (d) one or more inorganic Bi additives, wherein said inorganic Bi additives are selected from the group consisting of (1) Bi; (2) compounds that can generate elemental Bi; (3) oxides of Bi; and (4) mixtures thereof; and
   (e) an organic medium.

* * * * *